(12) United States Patent
Gao et al.

(10) Patent No.: US 12,197,833 B2
(45) Date of Patent: Jan. 14, 2025

(54) PERFORMANCE EVALUATION METHOD OF LNG AMBIENT AIR VAPORIZER

(71) Applicant: NORTH CHINA MUNICIPAL ENGINEERING DESIGN & RESEARCH INSTITUTE CO., LTD., Tianjin (CN)

(72) Inventors: Wenxue Gao, Tianjin (CN); Yingjie Hu, Tianjin (CN); Rongsong Yan, Tianjin (CN); Yan Wang, Tianjin (CN); Qingwei Miao, Tianjin (CN); Lin Yang, Tianjin (CN); Mingchang Yang, Tianjin (CN)

(73) Assignee: NORTH CHINA MUNICIPAL ENGINEERING DESIGN & RESEARCH INSTITUTE CO., LTD., Tianjin (CN)

(*) Notice: Subject to any disclaimer, the term of this patent is extended or adjusted under 35 U.S.C. 154(b) by 51 days.

(21) Appl. No.: 18/217,692

(22) Filed: Jul. 3, 2023

(65) Prior Publication Data

US 2024/0012968 A1 Jan. 11, 2024

(30) Foreign Application Priority Data

Jul. 8, 2022 (CN) .......................... 202210800002.3

(51) Int. Cl.
*G06F 30/28* (2020.01)
*G06F 30/23* (2020.01)

(52) U.S. Cl.
CPC .............. *G06F 30/28* (2020.01); *G06F 30/23* (2020.01)

(58) Field of Classification Search
CPC ................................ G06F 30/28; G06F 30/23
See application file for complete search history.

(56) References Cited

U.S. PATENT DOCUMENTS

| | | | |
|---|---|---|---|
| 2010/0089576 A1 | 4/2010 | Wideman et al. |
| 2024/0012968 A1 | 1/2024 | Gao et al. |

FOREIGN PATENT DOCUMENTS

| | | |
|---|---|---|
| CN | 106021659 A | 10/2016 |
| CN | 107576562 A | 1/2018 |

(Continued)

OTHER PUBLICATIONS

Jiang, Qingmei, et.al. Safety evaluation of long-distance pipe inclined butt joint circumferential weld. In Welding Technique, vol. 46, No. 09. Sep. 28, 2017. pp. 100-104+122.

(Continued)

*Primary Examiner* — Bijan Mapar

(57) ABSTRACT

The present disclosure discloses a performance evaluation method of a LNG ambient air vaporizer, comprising: step 1, performing a site test on an actually-operating LNG AAV and obtaining its parameters, performing a fluid-thermal coupling calculation and simulation of the LNG AAV by use of FEA software, then performing model modification based on the test results; step 2, performing fluid-thermal-structure coupling calculation of an AAV for validation in the FEA software, adding a submodel module for optimization and validation tests; step 3, performing fluid-thermal-structure coupling calculation on the LNG AAV to be evaluated under a design operation condition and an operation condition of the AAV to be put into service in a certain region, and evaluating the LNG AAV according to the results. The present disclosure can evaluate vaporization performance and fatigue life of the AAV simultaneously and has good operability and economical efficiency.

7 Claims, 10 Drawing Sheets

(56) References Cited

FOREIGN PATENT DOCUMENTS

| CN | 112507574 A | 3/2021 |
|---|---|---|
| CN | 112944717 A | 6/2021 |
| CN | 117172076 A | 12/2023 |

OTHER PUBLICATIONS

Jiajia Deng, et. al. LNG ship single-liquid tank pre-cooling heat transfer characteristic analysis and optimization. Gas and Heat, vol. 38, No. 11.Nov. 15, 2018. pp. 25-31.
Lin Yang, et. al. Comprehensive pipe gallery natural gas pipeline risk assessment based on AHP-DEMATEL method. Gas and Heat, vol. 42, No. 11. Nov. 30, 2022. pp. 1-8.
Wu Ling et al., Structural Stress Analysis and Strength Evaluation of Drying Tower in Liquefaction Station. 2019 11th International Conference on Measuring Technology and Mechatronics Automation (ICMTMA). Oct. 7, 2019. pp. 218-321.

PERFORMANCE EVALUATION METHOD OF LNG AMBIENT AIR VAPORIZER

CROSS-REFERENCE TO RELATED APPLICATION

This application claims priority from the Chinese patent application 202210800002.3 filed Jul. 8, 2022, the content of which is incorporated herein in the entirety by reference.

TECHNICAL FIELD

The present disclosure belongs to the field of thermal power engineering, and particularly relates to a performance evaluation method of a liquefied natural gas ambient air vaporizer.

BACKGROUND ART

A liquefied natural gas (LNG) ambient air vaporizer (AAV) is heat exchange equipment for heating LNG in finned tubes via convection of ambient air to make it completely evaporated into gas. The LNG AAV is widely applied to an LNG receiving terminal due to its energy conservation and environmental protection, safety and good economical efficiency.

In the actual operation service process, the AAV is likely to have problems of low outlet temperature of natural gas and insufficient vaporizing capacity due to differences in ambient conditions and operation parameters in different application regions. This is because the outlet temperature of the natural gas mainly depends on a degree of convection heat exchange between the vaporizer and the ambient air and a flow velocity of a vaporization medium; a decrease in the flow velocity will increase the outlet temperature but lead to a decrease in the vaporization capacity of LNG; and if the flow velocity is kept unchanged, the outlet temperature of the natural gas will be decreased as the ambient temperature is decreased. In addition, the AAV may crack locally after operating for a long time, resulting in a leakage accident, for the reason that when it is frequently started and stopped and operates under variable loads, the flow velocity, temperature and pressure of the vaporization medium in the AAV will change obviously, and fluid in the tubes may be hydraulically impacted, resulting in fatigue damage of a pipeline system of the vaporizer.

At present, there are fewer articles about the evaluation on performance of the LNG AAV. Due to properties of low temperature and flammability of the LNG, high potential safety hazards may exist during a performance test. Meanwhile, when the LNG used in the test passes through the vaporizer to be vaporized, it cannot be effectively utilized subsequently, resulting in a resource waste.

At present, liquid nitrogen is mostly adopted for replacing the LNG for the AAV's performance test. The disclosure patent with the publication number of CN111198106A has disclosed a method for testing a vaporization capacity of an LNG AAV by liquid nitrogen and a test system. In the disclosure, outlet and inlet temperatures and pressures of the LNG AAV are measured by the liquid nitrogen, and the vaporization capacity of LNG in a reference state is calculated through a formula. The disclosure patent with the publication number of CN111721563A has disclosed a method and device for testing performance failure of an LNG AAV. In the disclosure, the liquid nitrogen is adopted as a vaporization medium to test stress and strain of the vaporizer on the test device. However, the above patents cannot avoid a calculation error caused by the difference in performance parameters of nitrogen and natural gas, and cannot simultaneously test the vaporization capacity and stress value of the vaporizer, that is, the vaporization performance and the fatigue life of the vaporizer cannot be linked. In addition, under different ambient conditions and operation conditions, it is necessary to carry out several experiments, which is very inconvenient and has poor operability and economical efficiency.

SUMMARY

The present disclosure aims at providing a performance evaluation method of a LNG AAV, which can simultaneously evaluate vaporization performance and fatigue life of the AAV, and meanwhile has good operability and economical efficiency.

In order to fulfill the above technical objectives, the present disclosure adopts the following technical solutions:

A performance evaluation method of a LNG ambient air vaporizer in the present disclosure includes the following steps:

step 1, performing a site test on an actually-operating LNG AAV and obtaining its parameters, establishing a fluid-thermal coupling calculation method of the LNG AAV by use of finite element analysis (FEA) software, then performing analog simulation and model modification on the LNG AAV, and obtaining optimized fluid-thermal coupling condition settings of the LNG AAV, wherein specific processes are as follows:

S10: detailed steps of performing a site test on the LNG AAV are as follows: performing an actual operation test on the LNG AAV with LNG as a vaporization medium targeting at the LNG AAV, to obtain the temperature distribution of finned tubes of the LNG AAV and vaporization performance of the vaporizer, wherein the temperature distribution of the finned tubes comprises an outer wall temperature $T_{n,fin}$ of each finned tube on an outermost layer, and the vaporization performance of the AAV comprises a vaporization medium outlet temperature $T_{p,out}$, a vaporization medium outlet pressure $P_{p,out}$ and a vaporization medium outlet flow velocity $v_{p,out}$ at a vaporizer outlet, and an actual vaporization capacity $Q_{out}$ of the vaporizer during operation;

S11: detailed steps of obtaining the parameters of the LNG AAV, comprising dimension parameters of the LNG AAV needed in a geometric modeling process, material parameters of the AAV needed for setting a vaporizer material property in a simulation platform of the FEA software, vaporization medium physical parameters needed for setting a vaporization medium material property in a numerical simulation analysis platform of the FEA software, and operation environment parameters and operation parameters of the AAV needed for setting boundary conditions in the FEA software;

S20: establishing, by three-dimensional geometric modeling software, an overall geometric model of the AAV according to the structural parameters of the AAV in an equal ratio of 1:1, then meshing the overall geometric model by finite element meshing software, and dividing calculation domains into a vaporization medium fluid domain, a vaporizer solid domain and an air fluid domain; wherein the vaporization medium fluid domain is a flow zone of the vaporization medium in an internal passage of the vaporizer; the vaporizer solid domain is a vaporizer body; and the air fluid domain is an air flow zone in a virtual hexahedron wrapping the vaporizer body, and a minimum distance between a top of the virtual hexahedron and the vaporizer, a minimum distance between a bottom thereof and the vaporizer, and minimum distances between side faces thereof and the vaporizer are at least 0.5 m, respectively;

S21: performing, by the FEA software, fluid-thermal coupling simulated calculation, to obtain temperature distribution of the AAV, wherein specific processes are as follows:

S210: adding, by the simulation platform in the FEA software, a fluid analysis module and a thermal analysis module;

S211: importing the meshed overall geometric model of the AAV into the fluid analysis module, wherein the vaporization medium fluid domain, the vaporizer solid domain and the air fluid domain are used as calculation domains; performing data transfer between the vaporization medium fluid domain and the vaporizer solid domain and between the air fluid domain and the vaporizer solid domain via heat connection surfaces respectively, to achieve conservative transfer of heat flux and temperatures; and selecting a multiphase model, a viscous model, a evaporation-condensation model, a continuity equation, a momentum equation and an energy equation in the fluid analysis module, wherein a standard wall-function method is adopted for near wall processing, a Mixture model is used as the multiphase model, a Realizable k-E model is used as the viscous model, and a Lee model is used as the evaporation-condensation model;

S212: setting the boundary conditions of the fluid analysis module, wherein an outlet of the vaporization medium fluid domain is set as a pressure outlet boundary, with a pressure being equivalent to the vaporization medium outlet pressure in the operation parameters; an inlet of the vaporization medium fluid domain is set as a velocity inlet boundary, with velocity and temperature being equivalent to the vaporization medium inlet flow velocity and the vaporization medium inlet temperature in the operation parameters; a top and a side face of the air fluid domain are set as pressure inlet boundaries, with pressure and temperature being equivalent to an atmospheric pressure and an ambient temperature in the operation environment parameters, and a bottom of the air fluid domain is set as a heat insulating wall; a fluid material of the vaporization medium fluid domain is set as LNG, with material parameters deriving from existing physical parameter data of the LNG; and a fluid material of the air fluid domain is set as air, with material parameters deriving from the material database in the simulation software;

S213: performing, by the fluid analysis module, fluid heat exchange simulation analysis on the AAV, to obtain temperature distribution and pressure distribution data of an inner wall 8 of the solid domain of the AAV and temperature distribution data of an outer wall 7 of the solid domain of the AAV; and outputting the vaporization medium outlet temperature $T_{out}$ and the vaporization medium outlet flow velocity $v_{out}$ of the AAV;

S214: transferring the overall geometric model in the fluid analysis module into the thermal analysis module, and inputting the material parameters of the AAV into the thermal analysis module, wherein the vaporizer material parameters in step S11 are used as the material parameters, and the vaporizer solid domain is used as the calculation domain; then transferring the temperature distribution data of the inner wall and the temperature distribution data of the outer wall 7 of the solid domain of the AAV obtained by the fluid analysis module via simulated calculation into the thermal analysis module to serve as the boundary condition of the thermal analysis module, and performing, by the thermal analysis module, thermal simulation analysis on the body of the AAV to obtain temperature distribution data of the vaporizer body; and inputting calculated result data output by the thermal analysis module into computational fluid dynamics (CFD) post-processing software, and then outputting a temperature contour of the body of the AAV;

S30: validating accuracy of a fluid-thermal coupling calculated result, and modifying a relevant model, wherein specific processes are as follows:

performing comparative calculation on the vaporization medium outlet temperature $T_{out}$ obtained in step S213 and the vaporization medium outlet temperature $T_{p,out}$ obtained in step S10 to obtain a first error value $\delta_1$, wherein a calculation formula is $\delta_1 = |T_{out} - T_{p,out}|/T_{p,out} * 100\%$; selecting, by the CFD result visualization software, point locations the same as those in the temperature fields of the finned tubes in step S10 from the temperature contour of the body of the AAV, and determining a temperature $T_{n,fin}$ of each point location; then performing comparative calculation on the temperature $T_{n,fin}$ and the test result $T_{pn,fin}$ of the temperature fields of the finned tubes in step S10 to obtain a second error value $\delta_2$, wherein a calculation formula is $\delta_2 = |\Sigma T_{n,fin} - \Sigma T_{pn,fin}|\Sigma T_{pn,fin} * 100\%$, where, $\Sigma T_{pn,fin}$ indicates a summation of a temperature of a middle position of an outer wall of each finned tube on the outermost layer of the vaporizer in the test result of the temperature fields of the finned tubes in step S10, and $\Sigma T_{n,fin}$ indicates a summation of the temperature of each point location obtained after selecting the point locations the same as those in the temperature fields of the finned tubes in step S10 from the temperature contour; and if the first error value $\delta_1$ or the second error value $\delta_2$ goes beyond 5%, modifying the Mixture model, the Realizable k-ε viscous model and the evaporation-condensation Lee model in the fluid analysis module in step S211 till the first error value $\delta_1$ and the second error value $\delta_2$ output based on simulated calculation after model modification are both less than or equal to 5%, and then taking the Mixture model, the Realizable k-ε model and the Lee model in the optimized fluid analysis module as optimized fluid-thermal coupling condition settings for fluid-thermal-structure coupling calculation in a next step;

step 2: adopting the modified fluid-thermal coupling condition settings in step 1 in the FEA software to establish a fluid-thermal-structure coupling calculation method of an AAV for validation, then performing fluid-thermal-structure coupling calculation, adding a submodel module for optimization and validation tests, and solving a stress value of a final stress concentration zone of the AAV, wherein specific processes are as follows:

S40: determining material parameters of the AAV for validation, wherein a material of the AAV for validation should be the same as that of an AAV to be evaluated;

S41: obtaining a S-N (stress-life) curve of the material of the AAV for validation; and sampling the material of the AAV for validation, then performing a material tensile test and a material fatigue test to obtain a stress S-N curve via fitting, and obtaining a relational expression Log(N)=a+b*Log(S), where, a and b are constant terms;

S50: performing geometric modeling, mesh generation and the determination of the calculation domains of the AAV for validation via the method as mentioned in step S20;

S51: performing, by the FEA software, fluid-thermal-structure coupling simulated calculation to obtain temperature and stress contours of the body of the AAV validation, wherein specific processes are as follows:

S511: replacing the AAV model with the AAV model for validation, executing step S210, replacing the fluid-thermal coupling condition in step S211 with the optimized fluid-thermal coupling condition in S30, setting the fluid material of the vaporization medium fluid domain as liquid nitrogen, with parameters deriving from existing physical parameter data of the liquid nitrogen, and then executing steps S211-S214, to obtain a vaporization medium outlet temperature $T_{out}$ and a vaporization medium outlet flow velocity $v_{out}$ of the AAV for validation and temperature distribution of the body of the AAV for validation;

S512: adding, by the simulation platform in the FEA software, a structural mechanical analysis module, and transferring the geometric model for validation, mesh generation and calculation domains in the thermal analysis module adopted in step S511 into the mechanical analysis module, wherein the vaporizer material parameters obtained in step S40 are used as the material parameters; then performing data transfer between the fluid analysis module adopted in step S511 and the mechanical analysis module, and transferring pressure distribution data of the inner wall of the solid domain of the AAV for validation obtained by the fluid analysis module via simulated calculation into the mechanical analysis module as a boundary condition of the mechanical analysis module; meanwhile performing data transfer between the thermal analysis module and the mechanical analysis module, and transferring temperature distribution data of the body of the AAV for validation obtained by the thermal analysis module via simulated calculation into the mechanical analysis module as a boundary condition of the mechanical analysis module; and finally setting each finned tube on an outermost layer of the AAV for validation as a fixed constraint in the mechanical analysis module, setting an inlet end and an outlet end of the AAV for validation as non-friction constraints in the mechanical analysis module, then obtaining, by the mechanical analysis module, stress data of the body of the AAV for validation via calculation, and outputting the stress contour of the body of the AAV for validation;

S52: performing an experimental test on structural stress of the AAV for validation with the liquid nitrogen as a vaporization medium under a certain operation condition and a certain ambient condition, to obtain a stress concentration zone of the AAV for validation and stress values thereof; wherein the experimental test on the structural stress of the vaporizer is performed as follows: pasting strain gages near welded positions of an inlet manifold and branches of the vaporizer and welded positions of the branches and each finned tube on an inlet manifold side before the vaporizer works, and then measuring stress at a point location of each strain gage when the vaporizer works;

S60: adding, by the simulation platform in the FEA software, the submodel module, performing mesh refinement and feature processing on a geometric model of the submodel module, and then modifying coefficients in the material property, wherein specific processes are as follows:

S601: adopting a maximum stress point location in the stress contour output by the mechanical analysis module in step S512 and a maximum stress point location in a structural stress experimental test result in step S52 as initial stress concentration zones of the AAV for validation, and then adding, by the simulation platform in the FEA software, the submodel module; transferring the material property parameters of the mechanical analysis module into the submodel module in the context of the mechanical analysis module as a body, extracting part of geometric solids around the initial stress concentration zone from the geometric model in the submodel module, performing mesh refinement processing, and performing feature processing on welded positions at connection positions between the inlet manifold and the inlet branches and between an outlet manifold and the outlet branches, wherein the feature processing refers to a process of transforming right-angle connection of the manifolds and the branches into arc transition connection in a process of establishing the geometric model, such that a connection manner thereof in the model is similar to actual connection of the welded positions, so as to obtain an optimized submodel; and then performing data transfer between the mechanical analysis module and the submodel module, transferring stress data of the AAV for validation in step S512 obtained by the mechanical analysis module via calculation into the submodel module as a boundary condition of the submodel module, and solving a stress value of a final stress concentration zone of the AAV for validation;

S602: performing comparative calculation on a maximum stress value $S_{max}$ of the final stress concentration zone output by the submodel module and a stress point maximum value $S_{p,max}$ in the structural stress experimental test result in step S52 to obtain a third error value $\delta_3$, wherein a calculation formula is $\delta_3=|S_{max}-S_{p,max}|/S_{p,max}*100\%$; modifying the setting of the material parameters in step S512 if the third error value $\delta_3$ goes beyond 5% till the third error value $\delta_3$ is within 5%, so as to ensure that the final stress concentration zone and stress value thereof are accurately output under the optimized calculation setting; wherein the material parameters comprise heat conduction coefficient, elasticity modulus, heat expansion coefficient, tensile strength, yield strength and the like in the material parameters; and then taking the modified heat conduction coefficient, elasticity modulus, heat expansion coefficient and tensile strength and yield strength as optimized fluid-thermal-structure coupling calculation setting conditions for fluid-thermal-structure coupling calculation setting conditions of the AAV to be evaluated in a next step;

step 3, establishing a geometric model of the LNG AAV to be evaluated, performing fluid-thermal-structure coupling calculation on the LNG AAV to be evaluated under a design operation condition and an operation condition of the AAV to be put into service in a certain region according to the optimized fluid-thermal-structure coupling calculation setting conditions in step 2, outputting an outlet temperature $T_{out}$, an outlet flow velocity $v_{out}$ and a stress value of a final stress concentration zone of the LNG AAV to be evaluated, and evaluating vaporization performance and fatigue life of the LNG AAV to be evaluated, wherein specific processes are as follows:

S70: determining a design vaporization capacity $Q_s$, a design pressure $P_s$ and structural parameters of the AAV to be evaluated and a historical ambient maximum temperature $T_{a,max}$, minimum temperature $T_{a,min}$ and average temperature $T_{a,ave}$ of a region where the LNG AAV to be evaluated will be applied and an operation vaporization capacity $Q_r$, an operation pressure $P_r$ and a daily start-stop frequency f of the AAV to be put into service; and performing geometric modeling, mesh generation and the determination of calculation domains of the LNG AAV to be evaluated via a method as mentioned in step S20;

S71: performing, by the simulation platform in the FEA software, fluid-thermal-structure coupling calculation on the LNG AAV to be evaluated, and outputting a vaporization medium outlet temperature $T_{out}$, a vaporization medium outlet flow velocity $v_{out}$ and a final stress concentration zone of the LNG AAV to be evaluated, wherein specific processes are as follows:

S711: replacing the AAV model for validation in step S511 with the model of the LNG AAV to be evaluated, and then modifying the boundary conditions of the fluid analysis module in step S511: modifying the outlet pressure of the vaporization medium fluid domain into the design pressure $P_s$ of the AAV to be evaluated; wherein a calculation formula of an inlet velocity $v_s$ of the vaporization medium fluid domain is $v_s = Q_s * \rho_n * P_n * T_n / (3600 * B * \rho_{in} * P_{in} * T_{in})$, where, B is a cross-sectional area of an inlet of the vaporizer, $\rho_{in}$ is density of a vaporization medium at pressure of $P_{in}$, $P_{in}$ is a vaporization medium inlet pressure, $T_{in}$ is a vaporization medium inlet temperature, $Q_s$ is the design vaporization capacity of the AAV to be evaluated, a vaporization medium outlet temperature of an air fluid domain is 20° C. under a standard condition, and the material property of a medium fluid domain is set as LNG; and then operating step S511, and outputting the vaporization medium outlet temperature $T_{out}$ and the vaporization medium outlet flow velocity $v_{out}$ of the LNG AAV to be evaluated under the design operation condition;

S712: replacing the fluid-thermal-structure coupling condition in step S512 with the optimized fluid-thermal-structure coupling condition to operate step S512;

S713: operating step S601, and outputting the stress value of the final stress concentration zone of the LNG AAV to be evaluated under the design operation condition;

S714: performing simulated calculation on the to-be-evaluated vaporizer under the operation condition of the AAV to be put into service after completing simulated calculation under the design operation condition; setting the outlet pressure of the vaporization medium fluid domain as the operation pressure $P_r$, wherein a calculation formula of inlet velocity ($v_s$) of the vaporization medium fluid domain is $v_s = Q_r * \rho_n * P_n * T_n / (3600 * B * \rho_r * P_r * T_{in})$, where, $\rho_r$ is density of the vaporization medium at the pressure of $P_r$, $Q_r$ is the operation vaporization capacity of the AAV to be evaluated, and temperatures of the air fluid domain are set as the historical ambient maximum temperature $T_{a,max}$, minimum temperature $T_{a,min}$ and average temperature $T_{a,ave}$ of the region where the to-be-evaluated vaporizer is applied respectively; and then repeating step S711 to step S714 for simulated calculation, and outputting the outlet temperature $T_{out}$, the outlet flow velocity $v_{out}$ and the final stress concentration zone of the AAV to be evaluated under the operation parameters till completing coupling simulated calculation at different historical ambient temperatures $T_a$;

S80: evaluating the vaporization performance and the fatigue life of the LNG AAV under the design operation condition and the operation condition of the AAV to be put into service.

The present disclosure has the advantages:

1. The performance evaluation method of the LNG AAV, provided by the present disclosure, can evaluate the vaporization performance of the AAV under the design operation condition and the actual operation condition, determine the applicability of the vaporizer in different regions, and provide an important basis for model selection of the vaporizer, so as to avoid low efficiency caused by insufficient vaporization performance in subsequent use; and it can also evaluate the fatigue life of the vaporizer due to frequent start-stop operation and illustrate the fatigue life of the vaporizer under different conditions, thereby avoiding cracking caused by fatigue damage, so as to improve the operation safety of the vaporizer.

2. The present disclosure has good operability, safety and economical efficiency; fluid-thermal-structure coupling calculation is performed on the basis of fluid-thermal coupling heat transfer calculation of the AAV, the calculated quantity is reduced, and the temperature and stress contours of the vaporizer under the same operation condition can be output; and by optimizing the models and the coefficients and adding the submodel to perform mesh refinement and feature processing on welded positions, the method has high precision, and can accurately output positions and sizes of maximum stress points.

3. The present disclosure not only can evaluate the performance of LNG AAVs with different dimensions, but also can evaluate the performance of AAVs not put into service and operating in service. Structural parameters of other AAVs are input after evaluation is completed once, the geometric model is established again, and the performance of the AAVs with different dimensions operating in service can be evaluated. The method is simple and effective, and it is not necessary to perform the actual test under each operation condition repeatedly by low-temperature $N_2$ or LNG.

BRIEF DESCRIPTION OF THE DRAWINGS

Drawings of the specification constituting a part of the present disclosure are described for further understanding the present disclosure. Schematic embodiments of the present disclosure and descriptions thereof are schematic of the present disclosure, and are not construed as an improper limitation to the present disclosure.

IN THE FIGURES

Figure 1:
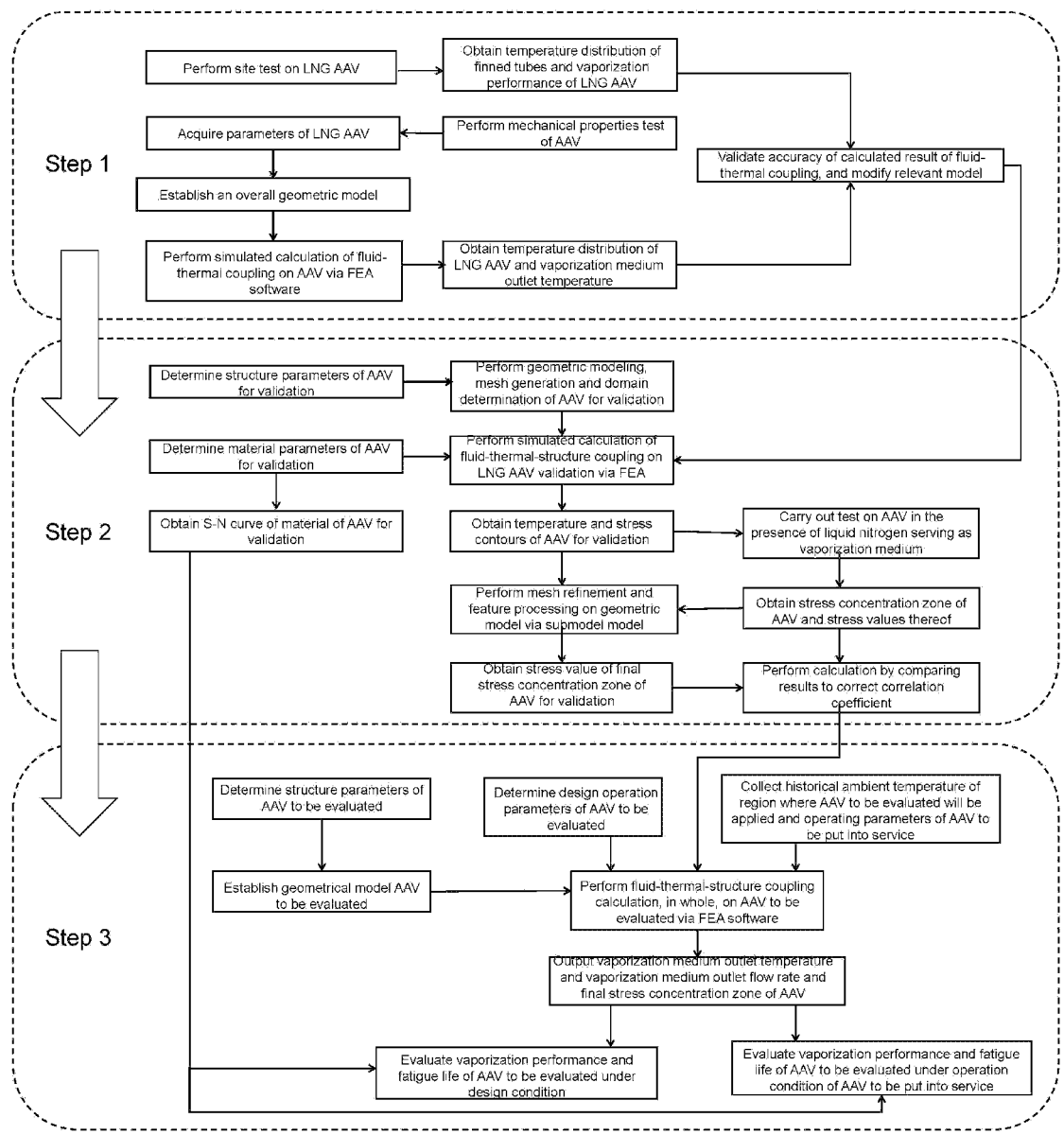
FIG. 1 is a flow diagram of a performance evaluation method according to the present disclosure.
Figure 2:
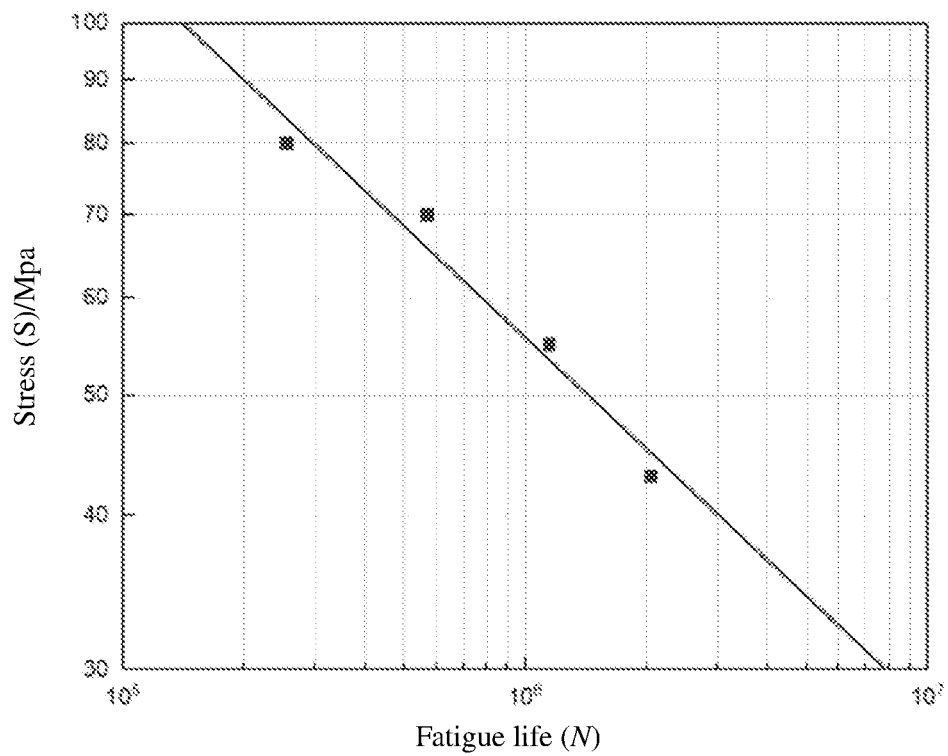
FIG. 2 is a S-N (stress-life) curve of an AAV material according to the present disclosure.

1. Finned tubes of AAV;
2. Inlet manifold of AAV;
3. Inlet branch of AAV;
4. U-shaped bend of AAV;
5. Outlet manifold of AAV;
6. Outlet branch of AAV;
7. Outer wall of solid domain of AAV;
8. Inner wall of solid domain of AAV;
9. Inlet of vaporization medium fluid domain;
10. Outlet of vaporization medium fluid domain;
11. Top of air fluid domain;
12. Side face of air fluid domain; and
13. Bottom of air fluid domain.

DETAILED DESCRIPTION OF THE PRESENT DISCLOSURE

It should be noted that the following detailed descriptions are exemplary, which are intended to further explain the present application. Unless otherwise indicated, all technical and scientific terms used herein have the same meaning as commonly understood by those ordinarily skilled in the prior art to which the present application pertains.

It should be noted that the terms used here are not intended to limit the illustrative implementations according to the present application, but are merely descriptive of the implementations. Unless otherwise directed by the context, singular forms of terms used here are intended to include plural forms. Besides, it should be also appreciated that, when the terms "comprise" and/or "include" are used in the specification, it is indicated that characteristics, steps, operations, devices, assemblies, and/or combinations thereof exist.

Additionally, any directional indication (such as upper, lower, left, right, front, back, or the like) involved in the embodiments of the present disclosure is only used for explaining relative position relations, movement conditions and the like of the components in a certain specific posture (as shown in figures). If the specific posture is changed, the directional indications may change accordingly.

As shown in the figures, a performance evaluation method of an LNG AAV in the present disclosure includes the following steps:

step 1, performing a site test on an actually-operating LNG AAV and obtaining its parameters, establishing a fluid-thermal coupling calculation method of the LNG AAV by use of finite element analysis (FEA) software, then performing analog simulation and model modification on the LNG AAV, and obtaining optimized fluid-thermal coupling condition settings of the LNG AAV, wherein specific processes are as follows:

S10: detailed process of performing the site test on the LNG AAV is as follows: an actual operation test is performed targeting at the LNG AAV with LNG as a vaporization medium, to obtain the temperature distribution of finned tubes 1 of the LNG AAV and vaporization performance of the vaporizer, wherein the temperature distribution of the finned tubes includes an outer wall temperature $T_{pn,fin}$ of each finned tube on an outermost layer, and the vaporization performance of the vaporizer includes a vaporization medium outlet temperature $T_{p,out}$, a vaporization medium outlet pressure $P_{p,out}$ and a vaporization medium outlet flow velocity $v_{p,out}$ at a vaporizer outlet, and an actual vaporization capacity $Q_{out}$ of the vaporizer during operation.

Preferably, the specific step of testing the distribution of the temperature fields of the finned tubes is as follows: a temperature in the middle position of an outer wall of each finned tube of the vaporizer on the outermost layer is measured using a temperature sensor.

The specific step of testing the vaporization performance of the vaporizer via experiments is as follows: the vaporization medium temperature $T_{p,out}$, the vaporization medium pressure $P_{p,out}$ and the vaporization medium flow velocity $v_{p,out}$ at the vaporizer outlet are collected respectively using the temperature sensor, a pressure gage, and a flow meter which are arranged at the outlet of the LNG AAV; then, the actual vaporization capacity $Q_{out}$ of the AAV during operation is calculated, that is, the vaporization capacity under the standard condition (temperature $T_n$ of 20° C., and pressure $P_n$ of 101.325 KPa), and a calculation formula is $Q_{out}=3600*v_{p,out}*A*\rho_{p,out}*P_{p,out}*T_{p,out}/(\rho_n*P_n*T_n)$, where A is a cross-sectional area of the vaporizer outlet, $\rho_{p,out}$ is a density of a vaporization medium under a pressure of $P_{p,out}$, $P_n$ is a pressure under the standard condition, $T_n$ is a temperature under the standard condition, and $P_n$ is a density of the vaporization medium under the standard condition.

S11: parameters of the LNG AAV are obtained, including dimension parameters of the LNG AAV, needed in a geometric modeling process, material parameters of the AAV needed for setting a vaporizer material property in a simulation platform of FEA software (e.g., ANSYS), physical property parameters of the vaporization medium needed for setting a vaporization medium material property, and operation environment parameters and operation parameters of the vaporizer needed for setting boundary conditions in the FEA software.

The dimension parameters of the AAV, needed in the geometric modeling process, may be obtained according to design drawings and actual site measurements of the vaporizer.

The material parameters of the AAV are those needed for setting the vaporizer material property in the simulation platform of the FEA software (e.g., ANSYS), such as density, specific heat capacity, heat conduction coefficient, elasticity modulus, thermal expansion coefficient, tension strength, and yield strength, which may be acquired according to a material database in simulation software and a mechanical property test of a base material. Further, when the mechanical property test is performed on the base material, mechanical tensile test samples with standard materials which are the same as that of the LNG AAV are used, and a tensile test and a fatigue test are performed at 35°

C. to −196° C. (a test method may be referred to GB/T228.1-2010 *Metallic Materials—Tensile Testing—Part 1: Method of Test at Room Temperature*, GB/T228.3-2019 *Metallic materials—Tensile Testing—Part 3: Method of Test at Low Temperature*, GB/Z40387-2021 *Metallic Materials—Principles and Designs for Multiaxial Fatigue Testing*) to acquire mechanical property parameters (elasticity modulus, thermal expansion coefficient, tension strength, and yield strength) and fatigue performance parameters (fatigue limit, and fatigue life) of the material at different ambient temperatures; and further, the mechanical tensile test samples with the standard materials are a weldless test sample and an equal-welded test sample.

The physical property parameters needed for setting the material property of the vaporization medium in the numerical simulation analysis platform of the FEA software such as density, specific heat capacity, heat conduction coefficient, and viscosity, may be acquired according to the material database in the simulation software and relevant books.

The operation environment parameters are physical property parameters of air environment needed for setting the boundary conditions in the numerical simulation analysis platform around operation environment of the vaporizer, such as ambient temperature, ambient humidity, atmospheric pressure, and direction and size of air velocity, which may be measured on site; and the operation parameters include the vaporization medium inlet temperature, the vaporization medium inlet flow velocity, the vaporization medium inlet pressure, the vaporization medium outlet temperature, the vaporization medium outlet flow velocity, the vaporization medium outlet pressure, and daily start-stop frequency of the vaporizer, which may be acquired according to the actual site measurement and the design drawings.

S20: establishing, by three-dimensional geometric modeling software, an overall geometric model of the AAV according to the structural parameters of the AAV in an equal ratio of 1:1, then meshing the overall geometric model by finite element meshing software, and dividing calculation domains into a vaporization medium fluid domain, a vaporizer solid domain and an air fluid domain; wherein the vaporization medium fluid domain is a flow zone of the vaporization medium in an internal passage of the vaporizer; the vaporizer solid domain is a vaporizer body; and the air-fluid domain is an air flow zone in a virtual hexahedron wrapping the vaporizer body, and a minimum distance between a top of the virtual hexahedron and the vaporizer, a minimum distance between a bottom thereof and the vaporizer, and minimum distances between side faces thereof and the vaporizer are at least 0.5 m, respectively.

Figure 3:
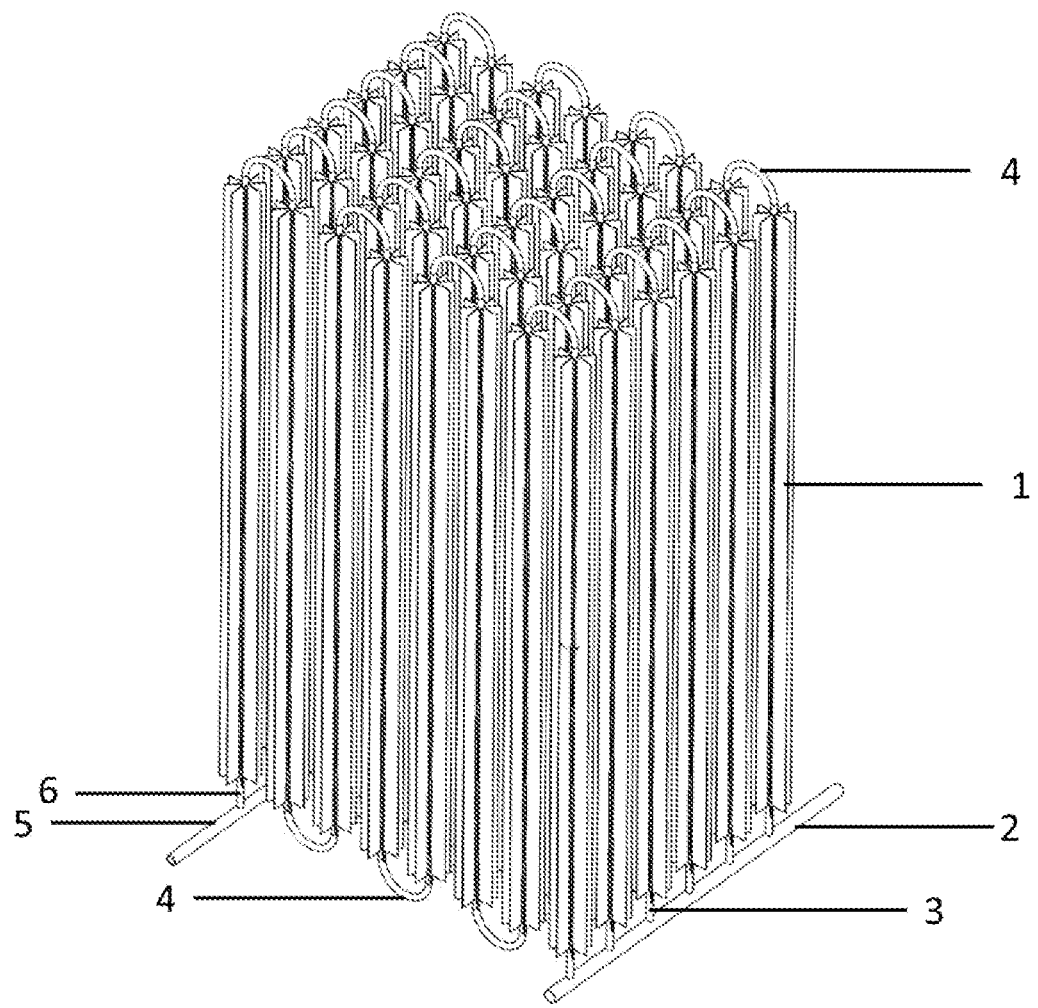
FIG. 3 is a geometric model of an AAV according to the present disclosure.
Figure 4:
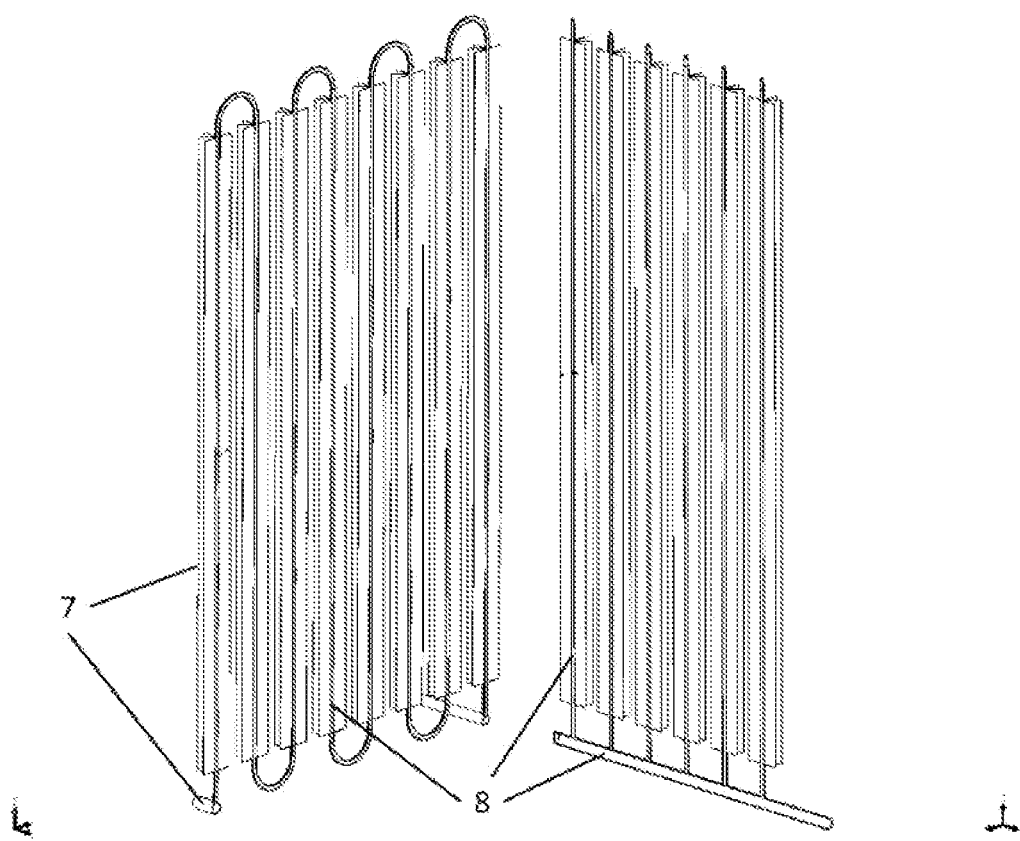
FIG. 4 is a cross-section diagram of a geometric model of an AAV according to the present disclosure.
Figure 5:
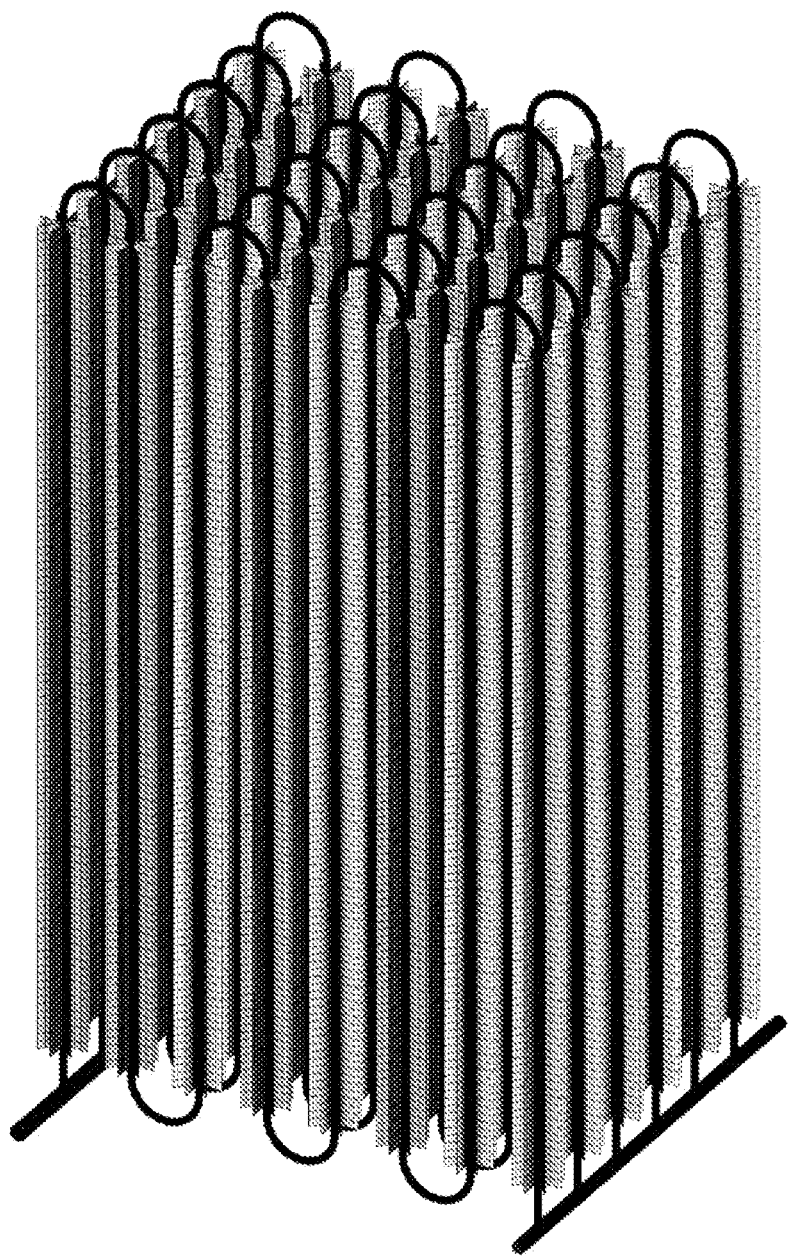
FIG. 5 is a schematic diagram of solid domain and mesh generation of an AAV according to the present disclosure.
Figure 6:
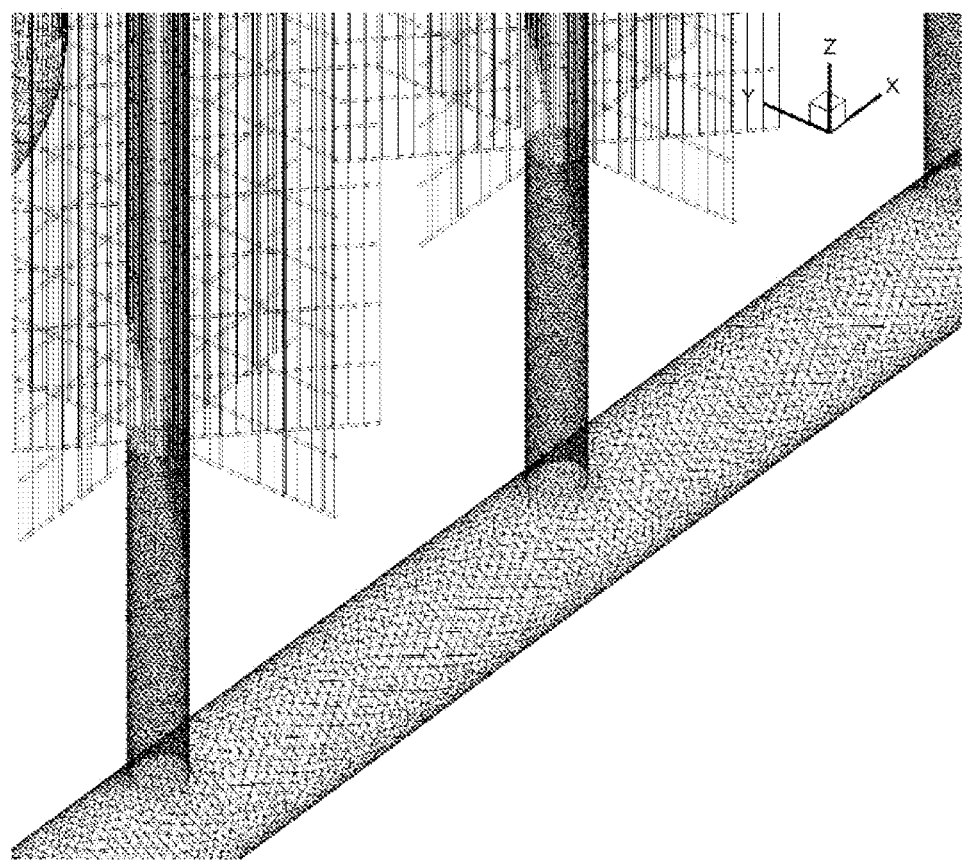
FIG. 6 is a local schematic diagram of mesh generation of an AAV according to the present disclosure.
Figure 7:
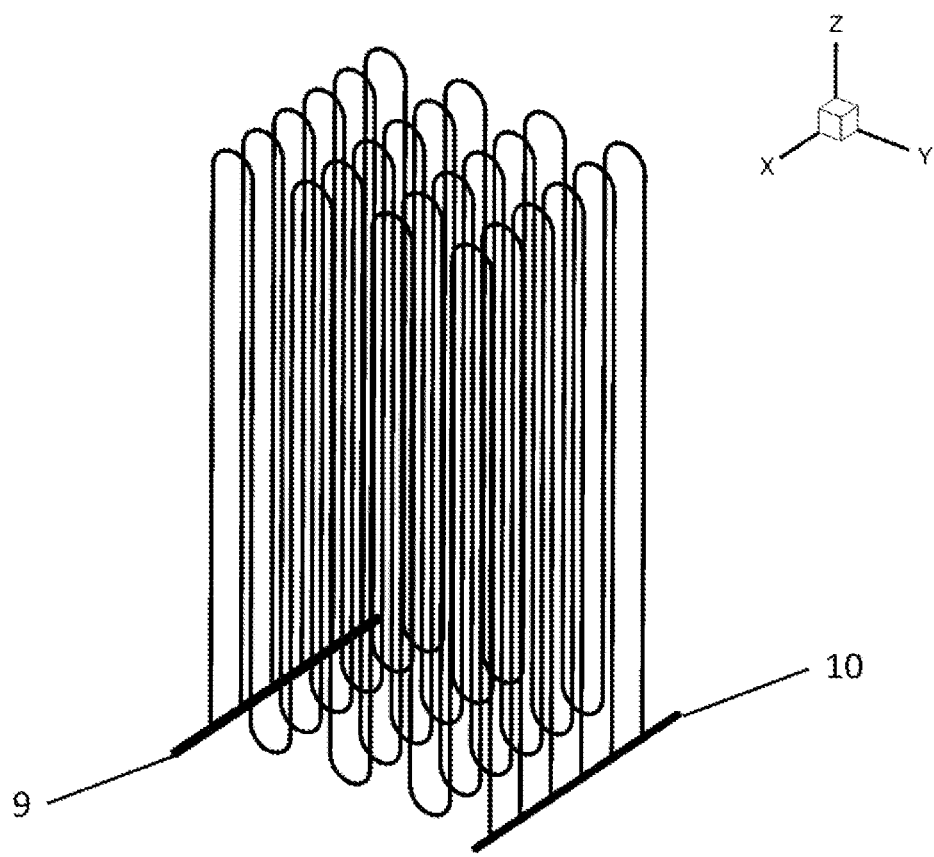
FIG. 7 is a schematic diagram of fluid domain of a vaporization medium of an AAV according to the present disclosure.
Figure 8:
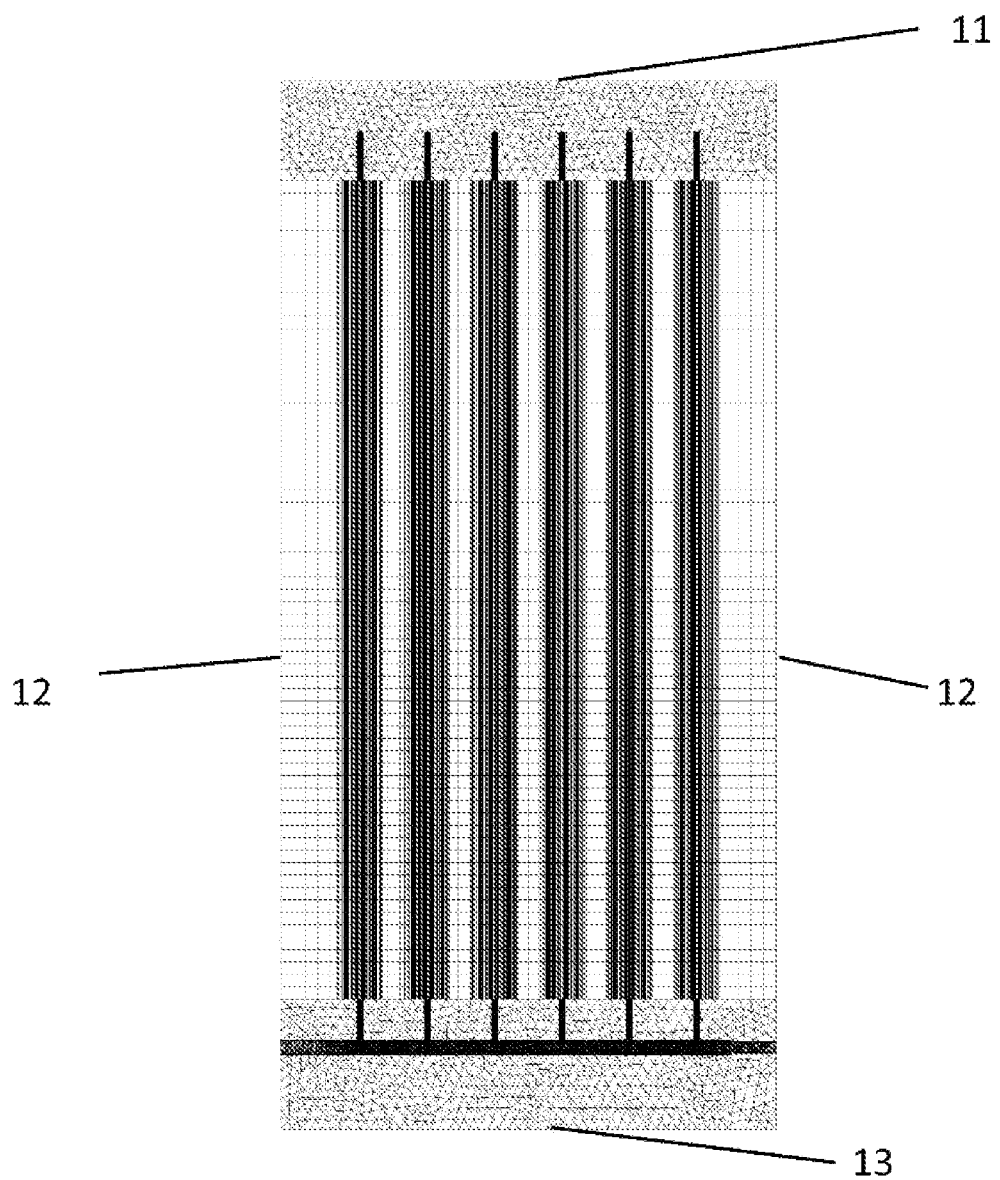
FIG. 8 is a schematic diagram of air-fluid domain and mesh generation according to the present disclosure.
Figure 9:
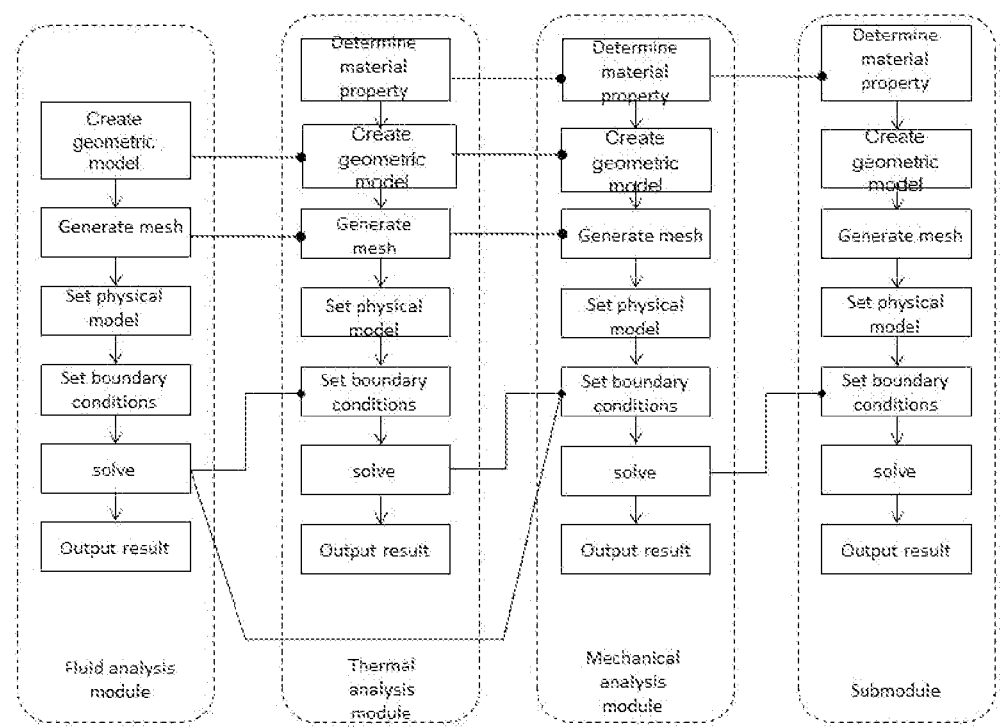
FIG. 9 is a flow chart of simulation process of fluid-thermal-structure coupling of an AAV according to the present disclosure.
Figure 10:
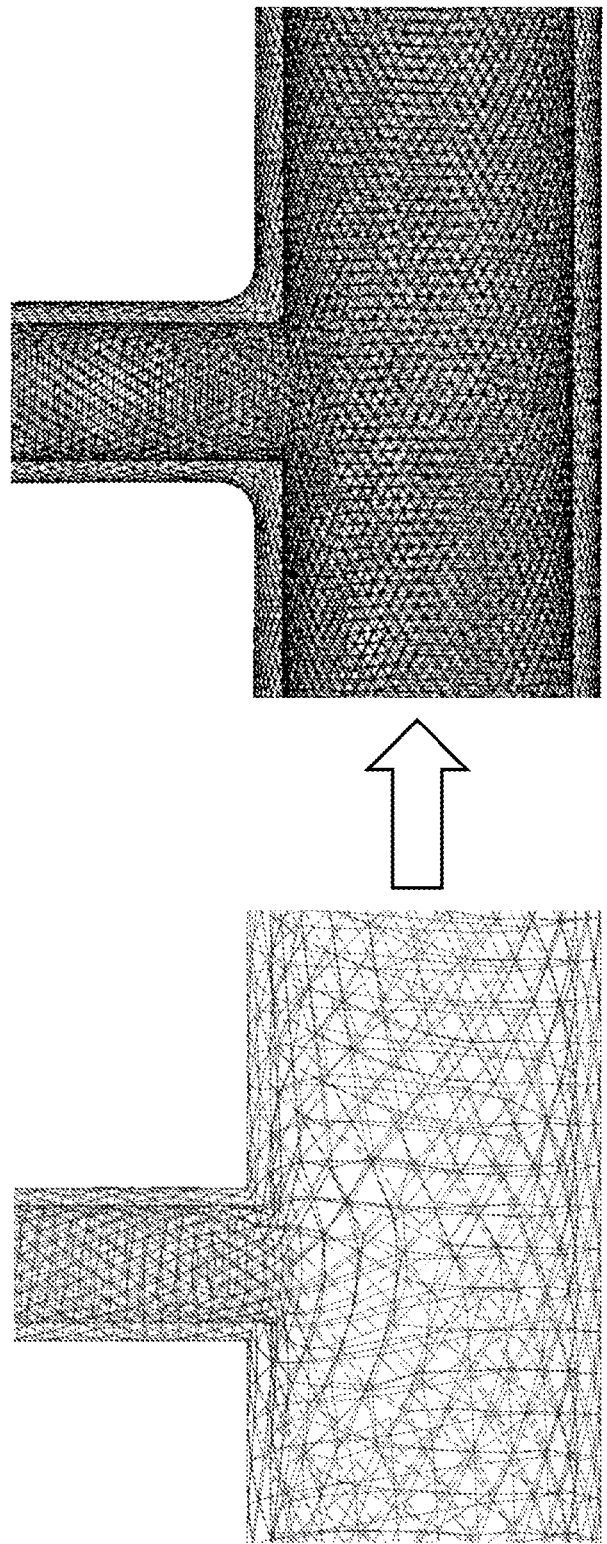
FIG. 10 is a schematic diagram of mesh refinement and feature processing of a geometric model in a submodule according to the present disclosure.

As shown in FIG. 3, the overall geometric model refers to modeling the vaporizer in an equal ratio (1:1) of the model to a material object; finite element mesh generation needs to take into account an interrelation among mesh quantity, mesh quality, calculation scale and accuracy of calculated results;

S21: performing, by the FEA software, fluid-thermal coupling simulated calculation, to obtain temperature distribution of the AAV, wherein specific processes are as follows:

S210: adding, by the simulation platform in the FEA software, a fluid analysis module and a thermal analysis module;

S211: importing the meshed overall geometric model of the AAV into the fluid analysis module, wherein the vaporization medium fluid domain, the vaporizer solid domain and the air fluid domain are used as calculation domains; performing data transfer between the vaporization medium fluid domain and the vaporizer solid domain and between the air fluid domain and the vaporizer solid domain via heat connection surfaces respectively, to achieve conservative transfer of heat flux and temperatures; and selecting the multiphase model, the viscous model, the evaporation-condensation model, the continuity equation, the momentum equation and the energy equation in the fluid analysis module, wherein the standard wall-function method is adopted for near wall processing, the Mixture model is used as the multi-phase flow model, the Realizable k-ε model is used as the viscous model, and the Lee model is used as the evaporation-condensation model;

S212: the boundary conditions of the fluid analysis module are set: an outlet 10 of the vaporization medium fluid domain is set as a pressure outlet boundary, with a pressure being equivalent to the vaporization medium outlet pressure in the operation parameters; an inlet 9 of the vaporization medium fluid domain is set as a velocity inlet boundary, with velocity and temperature being equivalent to the vaporization medium inlet flow velocity and the vaporization medium inlet temperature in the operation parameters; a top 11 and side faces 12 of the air-fluid domain are set as pressure inlet boundaries, with pressure and temperature being equivalent to the atmospheric pressure and the ambient temperature in the operation environment parameters; a bottom 13 of the air-fluid domain is set as a heat insulating wall; a fluid material of the vaporization medium fluid domain is set as LNG, with parameters (density, specific heat capacity, heat conduction coefficient, viscosity coefficient, standard state enthalpy, latent heat of vaporization, and the like) deriving from LNG-related physical property parameter data in the relevant book (*Technical Handbook of Liquefied Natural Gas*, China Machine Press, 2010); a flow material of the air-fluid domain is set as air, in which parameters (density, specific heat capacity, heat conduction coefficient, viscosity coefficient, and the like) derive from the material database in the simulation software;

S213: performing, by the fluid analysis module, fluid heat exchange simulation analysis on the AAV, to obtain temperature distribution and pressure distribution data of an inner wall 8 of the solid domain of the AAV and temperature distribution data of an outer wall 7 of the solid domain of the AAV; and outputting the vaporization medium outlet temperature $T_{out}$ and the vaporization medium outlet flow velocity $v_{out}$ of the AAV;

S214: the overall geometric model in the fluid analysis module is transferred to the thermal analysis module, and the material parameters of the AAV are input in the thermal analysis module, wherein the vaporizer material parameters in step S11 are used as the material parameters, and the vaporizer solid domain is used as the calculation domain; then the temperature distribution data of an inner wall 8 and the temperature distribution data of the outer wall 7 of the solid domain of the AAV, obtained by the fluid analysis module via simulated calculation, are transferred to the thermal analysis module to serve as the boundary conditions of the thermal analysis module, and heat simulation analysis is performed on the body of the AAV by the thermal analysis module to obtain temperature distribution data of the vaporizer body; and calculated result data output by the thermal analysis module is imported into CFD post-processing software (e.g., Tecplot 360), and then a temperature contour of the body of the AAV is output;

S30: validating accuracy of a fluid-thermal coupling calculated result, and modifying a relevant model, wherein specific processes are as follows:

Comparative calculation is performed on the vaporization medium outlet temperature $T_{out}$ in step S213 and the vaporization medium outlet temperature $T_{p,out}$ obtained in step S10 to obtain a first error value $\delta_1$, wherein a calculation formula is $\delta_1=|T_{out}-T_{p,out}|/T_{p,out}*100\%$; point locations the same as those in the temperature fields of the finned tubes in step S10 are selected from the temperature contour of the body of the AAV by the CFD result visualization software (e.g., Tecplot), and a temperature $T_{n,fin}$ of each point location is determined; then comparative calculation is performed on the temperature $T_{n,fin}$ with the test results $T_{pn,fin}$ of the temperature fields of the finned tubes in step S10 to obtain a second error value $\delta_2$, wherein a calculation formula is $\delta_2=|\Sigma T_{n,fin}-\Sigma T_{pn,fin}|/\Sigma T_{pn,fin}*100\%$, where, $\Sigma T_{pn,fin}$ indicates a summation of a temperature of a middle position of an outer wall of each finned tube on the outermost layer of the vaporizer in the test results of the temperature fields of the finned tubes in step S10, and $\Sigma T_{n,fin}$ indicates a summation of the temperature of each point location obtained after selecting the point locations the same as those in the temperature fields of the finned tubes in step S10 from the temperature contour; and if the first error value $\delta_1$ or the second error value $\delta_2$ goes beyond 5%, the Mixture model, the Realizable k-ε model and the Lee model in the fluid analysis module in step S211 are modified till the first error value $\delta_1$ and the second error value $\delta_2$ output based on simulated calculation with the modified models are both less than or equal to 5%, and then the optimized Mixture model, Realizable k-ε model and Lee model in the fluid analysis module are taken as optimized fluid-thermal coupling condition settings for the fluid-thermal-structure coupling calculation in a next step;

step 2: adopting the modified fluid-thermal coupling condition settings in step 1 in the FEA software to establish a fluid-thermal-structure coupling calculation method of an AAV for validation, then performing fluid-thermal-structure coupling calculation, adding a submodel module for optimization and validation tests, and solving a stress value of a final stress concentration zone of the AAV, wherein specific processes are as follows:

S40: determining material parameters of the AAV for validation, wherein a material of the AAV for validation should be the same as that of an AAV to be evaluated;

S41: a S-N (stress-life) curve of the material of the AAV for validation is obtained; and the material of the AAV for validation is sampled, then a material tensile test and a material fatigue test are performed to obtain an S-N curve via fitting, and a relational expression Log(N)=a+b*Log(S) is obtained, where, a and b are constant terms, which are deduced from curvilinear regression with data processing software; and the step may lay a theoretical basis for the evaluation on the fatigue life of the AAV.

S50: Performing geometric modeling, mesh generation and the determination of the calculation domains of the AAV for validation via a method as mentioned in step S20;

S51: performing, by the FEA software, fluid-thermal-structure coupling simulated calculation to obtain temperature distribution and stress contour of the body of the AAV validation, wherein specific processes are as follows:

S511: a model of the AAV is replaced with a model of the AAV for validation, and step S210 is executed; the fluid-thermal coupling condition in step S211 is replaced with the optimized fluid-thermal coupling condition in S30, and the fluid material of the vaporization medium fluid domain is set as liquid nitrogen, with parameters (density, specific heat capacity, heat conduction coefficient, viscosity coefficient, standard state enthalpy, latent heat of vaporization, and the like) deriving from liquid nitrogen related physical property parameter data in the relevant book (The Properties of GASES AND LIQUIDS, Chemical Industry Press, 2006); and steps S211-S214 are executed to obtain the vaporization medium outlet temperature $T_{out}$ and the vaporization medium outlet flow velocity $v_{out}$ of the AAV for validation and the temperature distribution of the body of the AAV;

S512: a mechanical analysis module is added by the simulation platform in the FEA software, and the geometric model for validation, mesh generation and the calculation domains in the thermal analysis module adopted in step S511 are transferred to the mechanical analysis module, wherein the vaporizer material parameters obtained in step S40 are used as the material parameters; then data transfer is performed between the fluid analysis module adopted in step S511 and the mechanical analysis module, and pressure distribution data of the inner wall 8 of the solid domain of the AAV for validation, obtained by the fluid analysis module via simulated calculation, is transferred to the mechanical analysis module as a boundary condition of the mechanical analysis module; meanwhile, data transfer is performed between the thermal analysis module and the mechanical analysis module, and temperature distribution data of the body of the AAV for validation, obtained by the thermal analysis module via simulated calculation, is transferred to the mechanical analysis module as a boundary condition of the mechanical analysis module; and finally each finned tube on an outermost layer of the AAV for validation is set as a fixed constraint in the mechanical analysis module, an inlet end and an outlet end of the AAV for validation is set as non-friction constraints in the mechanical analysis module, stress data of the body of the AAV for validation is obtained by the mechanical analysis module via calculation, and the stress contour of the body of the AAV for validation is output;

S52: an experimental test is performed on structural stress of the AAV for validation with the liquid nitrogen as a vaporization medium under a certain operation condition and a certain environmental condition, to obtain a stress concentration zone of the AAV for validation and stress values thereof for guiding the following simulated calculation correction.

The experimental test on the structural stress of the vaporizer is performed as follows: strain gages are pasted near welded positions of an inlet manifold 2 and inlet branches 3 of the vaporizer and welded positions of the inlet branches and each finned tube on an inlet manifold side before the vaporizer operates, and then stress at a point location of each strain gage when the vaporizer operates is measured.

As a preferred implementation of the present disclosure, in addition to pasting the strain gages near the welded positions of the manifold and the inlet branches of the vaporizer and the welded positions of the inlet branches and each finned tube on the inlet manifold side, the strain gages are also pasted in the stress concentration zone of the stress contour according to the stress contour output in step S512 for stress testing.

S60: Adding, by the simulation platform in the FEA software, the submodel module, performing mesh refinement and feature processing on a geometric model of the submodel module, and then modifying coefficients in the material property, wherein specific processes are as follows:

S601: a maximum stress point location in the stress contour output by the mechanical analysis module in step S512 and a maximum stress point location in a structural stress experimental test result in step S52 are used as initial stress concentration zones of the AAV for validation, and then the submodel module is added by the simulation platform in the FEA software; the material property parameters of the mechanical analysis module are transferred to the submodel module in the context of the mechanical analysis module as a body, part of geometric solids around the initial stress concentration zone are extracted from the geometric model in the submodel module, mesh refinement processing is performed, and the feature processing of welded positions at connection positions of the inlet manifold and the inlet branches and an outlet manifold 5 and outlet branches 6 is performed, wherein the feature processing refers to a process of transforming right-angle connection between the manifolds and the branches into arc transition connection in a process of establishing the geometric model, such that a connection manner thereof in the model is similar to the actual connection of the welded positions, so as to obtain an optimized submodel; and then data transfer is performed between the mechanical analysis module and the submodel module, stress data of the AAV for validation in step S512, obtained by the mechanical analysis module via calculation, is transferred to the submodel module as a boundary condition of the submodel module, and a stress value of a final stress concentration zone of the AAV for validation is solved. In this step, more accurate mesh data may be obtained, which is used for improving analysis accuracy and avoiding the occurrence of stress singularity, thereby obtaining an accurate solution of a stress concentration point.

S602: Comparative calculation is performed on a maximum stress value $S_{max}$ of the final stress concentration zone output by the submodel module and a maximum stress point value $S_{p,max}$ in the structural stress experimental test result in step S52 to obtain a third error value $\delta_3$, wherein a calculation formula is $\delta_3=|S_{max}-S_{p,max}|/S_{p,max}*100\%$; the setting of the material parameters, including heat conduction coefficient, elasticity modulus, thermal expansion coefficient, tensile strength, yield strength, and the like, in step S512 is modified if the third error value $\delta_3$ goes beyond 5% till the third error value $\delta_3$ is within 5%, so as to ensure that the final stress concentration zone and stress values thereof are output accurately under the optimized calculation setting; and then, the modified heat conduction coefficient, elasticity modulus, thermal expansion coefficient, tensile strength, and yield strength are taken as optimized fluid-thermal-structure coupling calculation setting conditions for the fluid-thermal-structure coupling calculation setting conditions of the AAV to be evaluated in a next step.

Step 3, establishing a geometric model of the LNG AAV to be evaluated, performing fluid-thermal-structure coupling calculation on the LNG AAV to be evaluated under a design operation condition and an operation condition of the AAV to be put into service in a certain region according to the optimized fluid-thermal-structure coupling calculation setting conditions in step 2, outputting an outlet temperature $T_{out}$, an outlet flow velocity $v_{out}$ and a stress value of a final stress concentration zone of the LNG AAV to be evaluated, and evaluating vaporization performance and fatigue life of the LNG AAV to be evaluated, wherein specific processes are as follows:

S70: design operation parameters (design vaporization capacity $Q_s$, and design pressure $P_s$) and structural parameters of the AAV to be evaluated are determined, and a historical ambient temperature $T_a$ (maximum temperature $T_{a,max}$, minimum temperature $T_{a,min}$ and average temperature $T_{a,ave}$) of a region where the LNG AAV to be evaluated will be applied and operating parameters (operation vaporization capacity Q, operation pressure $P_r$, and daily start-stop frequency f) of the AAV to be put into service; and geometric modeling, mesh generation and the determination of the calculation domains are performed on the AAV to be evaluated via a method as mentioned in step S20;

S71: performing, by the simulation platform in the FEA software, fluid-thermal-structure coupling calculation on the LNG AAV to be evaluated, and outputting a vaporization medium outlet temperature $T_{out}$, a vaporization medium outlet flow velocity $v_{out}$ and a final stress concentration zone of the LNG AAV to be evaluated, wherein specific processes are as follows:

S711: the model of the AAV for validation in step S511 is replaced with the model of the LNG AAV to be evaluated, and then the boundary conditions of the fluid analysis module in step S511 are modified, that is, the outlet pressure of the vaporization medium fluid domain is modified into the design pressure $P_s$ of the AAV to be evaluated; wherein a calculation formula of an inlet velocity $v_s$ of the vaporization medium fluid domain is $v_s=Q_s*\rho_n*P_n*T_n/(3600*B*\rho_{in}*P_{in}*T_{in})$, where, B is a cross-sectional area of an inlet of the vaporizer, $\rho_{in}$ is density of a vaporization medium at pressure of $P_{in}$, $P_{in}$ is a vaporization medium inlet pressure, $T_{in}$ is a vaporization medium inlet temperature, $Q_s$ is the design vaporization capacity of the AAV to be evaluated, a vaporization medium outlet temperature of air-fluid domain is 20° C. under a standard condition, and the material property of a medium fluid domain is set as LNG; and then step S511 is executed, and the vaporization medium outlet temperature $T_{out}$ and the vaporization medium outlet flow velocity $v_{out}$ of the LNG AAV to be evaluated under the design operation condition are output.

S712: The fluid-thermal-structure coupling condition in step S512 is replaced with the optimized fluid-thermal-structure coupling condition to implement step S512.

S713: Step S601 is executed to output the stress value of the final stress concentration zone of the LNG AAV to be evaluated under the design operation condition.

S714: Simulated calculation is performed on the to-be-evaluated vaporizer under the operation condition of the vaporizer to be put into service after completing simulated calculation under the design operation condition; the outlet pressure of the vaporization medium fluid domain is set as operation pressure $P_r$, wherein a calculation formula of inlet velocity $v_s$ of the vaporization medium fluid domain is $v_s = Q_r * \rho_n * P_n * T_n / (3600 * B * \rho_r * P_r * T_{in})$, where, $\rho_r$ is density of the vaporization medium at the pressure of $P_r$, $Q_r$ is the operation vaporization capacity of the AAV to be evaluated, and temperatures of the air-fluid domain are set as the historical ambient temperature $T_a$ (maximum temperature $T_{a,max}$, minimum temperature $T_{a,min}$ and average temperature $T_{a,ave}$) of the region where the to-be-evaluated vaporizer is applied respectively; and then steps S711 to S714 are repeated for simulated calculation, and the outlet temperature $T_{out}$, the outlet flow velocity $v_{out}$ and the final stress concentration zone of the AAV to be evaluated under the operation parameters are output till the simulated calculation of coupling is completed at different historical ambient temperatures $T_a$.

S80: the vaporization performance and the fatigue life of the LNG AAV are evaluated under the design operation condition and the operation condition of the vaporizer to be put into service:

The method for evaluating the performance of the LNG AAV under the design operation condition is as follows: the vaporization capacity $Q_{out}$ of the to-be-evaluated vaporizer corresponding to the outlet flow velocity $v_{out}$ is calculated according to the vaporization medium outlet temperature $T_{out}$ and the vaporization medium outlet flow velocity $v_{out}$ under the design operation condition, output in step S711, and the vaporization capacity calculation formula in step S10, and it is judged whether a difference between the vaporization medium outlet temperature $T_{out}$ and the ambient temperature $T_a$ meets requirements in standard GB/T 38530-2020 *Town Liquefied Natural Gas (LNG) Gasification Supply Installations*, to output whether the calculated vaporization capacity $Q_{out}$ is greater than or equal to the design vaporization capacity $Q_s$, so as to evaluate the vaporization performance of the AAV under the design operation condition.

The method for evaluating the performance of the LNG AAV under the operation condition of the vaporizer to be put into service is as follows: vaporization capacity $Q_{out}$ of the to-be-evaluated vaporizer corresponding to different outlet flow velocities $v_{out}$ are calculated according to the vaporization medium outlet temperature $T_{out}$ and the vaporization medium outlet flow velocity $v_{out}$ under the operation condition of the vaporizer to be put into service, output in step S714, and the vaporization capacity calculation formula in step S10, and it is judged whether a difference between the vaporization medium outlet temperature $T_{out}$ and the ambient temperature $T_a$ under operation conditions of different ambient temperatures $T_a$ meets requirements in standard GB/T 38530-2020 *Town Liquefied Natural Gas (LNG) Gasification Supply Installations*, to output whether the calculated vaporization capacity $Q_{out}$ are greater than or equal to the design vaporization capacity $Q_s$, so as to evaluate the vaporization performance of the AAV under the operation condition of the vaporizer to be put into service in a certain region.

The method for evaluating the fatigue life of the LNG AAV under the design operation condition is as follows: the stress values of the final stress concentration zone under the design operation condition output in step S713 are compared, the maximum stress value $S_{max}$ is selected and substituted into the stress-life (S-N) curve relational expression $Log(N)=a+b*Log(S)$ obtained in step S41, and the fatigue life frequency N of the vaporizer is calculated; and a maximum service life $n=N/(f*365)$ of the vaporizer is calculated according to the daily start-stop frequency f of the vaporizer, so as to achieve the evaluation on the fatigue life of the LNG AAV under the design operation condition.

The method for evaluating the fatigue life under the operation condition of the AAV to be put into service is as follows: stress values of the final stress concentration zone under the operation condition of the vaporizer to be put into service output in step S714 are compared, the maximum stress value $S_{max}$ is selected and substituted into the stress-life (S-N) curve relational expression $Log(N)=a+b*Log(S)$ obtained in step S41, and the fatigue life frequency N of the vaporizer is calculated; and a maximum service life $n=N/(f*365)$ of the vaporizer is calculated according to the daily start-stop frequency f of the vaporizer, so as to achieve the evaluation on the fatigue life of the LNG AAV operating in a certain region.

The above description is only the preferred embodiments of the present application, and is not intended to limit the present application, and for those skilled in the art, the present application may have various modifications and variations. Any modification, equivalent replacement, improvement, etc. made within the spirit and principle of the present application shall fall within the protection scope of the present application.

The invention claimed is:

1. A performance evaluation method of a liquefied natural gas (LNG) ambient air vaporizer (AAV), comprising the following steps:
    step 1, performing a site test on an actually-operating LNG AAV and obtaining its parameters, establishing a fluid-thermal coupling calculation method of the LNG AAV by use of finite element analysis software, then performing analog simulation and model modification on the LNG AAV, and obtaining optimized fluid-thermal coupling condition settings of the LNG AAV, wherein specific processes are as follows:
    S10: performing a site test on the LNG AAV as follows: performing an actual operation test on the LNG AAV with LNG as a vaporization medium targeting at the LNG AAV, to obtain the temperature distribution of finned tubes of the LNG AAV and vaporization performance of the vaporizer, wherein the temperature distribution of the finned tubes comprises an outer wall temperature $T_{pn,fin}$ of each finned tube on an outermost layer, and the vaporization performance of the AAV comprises a vaporization medium outlet temperature $T_{p,out}$, a vaporization medium outlet pressure $P_{p,out}$ and a vaporization medium outlet flow velocity $v_{p,out}$ at a vaporizer outlet, and an actual vaporization capacity $Q_{out}$ of the vaporizer during operation;
    S11: obtaining the parameters of the LNG AAV, comprising dimension parameters of the LNG AAV needed in a geometric modeling process, material parameters of the AAV needed for setting a vaporizer material property in a simulation platform of a finite element analysis (FEA) software, vaporization medium physical parameters needed for setting a vaporization medium material property in the FEA software, and operation environment parameters and operation parameters of the AAV needed for setting boundary conditions;
    S20: establishing, by three-dimensional geometric modeling software, an overall geometric model of the AAV according to the structural parameters of the AAV in an equal ratio of 1:1, then meshing the overall geometric model by finite element meshing software, and dividing calculation domains into a vaporization medium fluid domain, a vaporizer solid domain and an air fluid domain; wherein
    the vaporization medium fluid domain is a flow zone of the vaporization medium in an internal passage of the vaporizer; the vaporizer solid domain is a vaporizer body; and the air fluid domain is an air flow zone in a virtual hexahedron wrapping the vaporizer body, and a minimum distance between a top of the virtual hexahedron and the vaporizer, a minimum distance between a bottom thereof and the vaporizer, and minimum distances between side faces thereof and the vaporizer are at least 0.5 m, respectively;

S21: performing, by the FEA software, fluid-thermal coupling simulated calculation, to obtain temperature distribution of the AAV, wherein specific processes are as follows:

S210: adding, by the simulation platform in the FEA software, a fluid analysis module and a thermal analysis module;

S211: importing the meshed overall geometric model of the AAV into the fluid analysis module, wherein the vaporization medium fluid domain, the vaporizer solid domain and the air fluid domain are used as calculation domains; performing data transfer between the vaporization medium fluid domain and the vaporizer solid domain and between the air fluid domain and the vaporizer solid domain via heat connection surfaces respectively, to achieve conservative transfer of heat flux and temperatures; and selecting the multiphase model, a viscous model, a evaporation-condensation model, a continuity equation, a momentum equation and an energy equation in the fluid analysis module, wherein a standard wall-function method is adopted for near wall processing, the Mixture model is used as the multi-phase flow model, a Realizable k-ε model is used as the viscous model, and a Lee model is used as the evaporation-condensation model;

S212: setting the boundary conditions of the fluid analysis module, wherein an outlet of the vaporization medium fluid domain is set as a pressure outlet boundary, with a pressure being equivalent to the vaporization medium outlet pressure in the operation parameters; an inlet of the vaporization medium fluid domain is set as a velocity inlet boundary, with a velocity and a temperature being equivalent to the vaporization medium inlet flow velocity and the vaporization medium inlet temperature in the operation parameters; a top and a side face of the air fluid domain are set as pressure inlet boundaries, with pressure and temperature being equivalent to an atmospheric pressure and an ambient temperature in the operation ambient parameters, and a bottom of the air fluid domain is set as a heat insulating wall; a fluid material of the vaporization medium fluid domain is set as LNG, with parameters deriving from existing physical parameter data of the LNG; and a fluid material of the air fluid domain is set as air, in which parameters derive from the material database in the simulation software;

S213: performing, by the fluid analysis module, fluid heat exchange simulation analysis on the AAV, to obtain temperature distribution and pressure distribution data of an inner wall of the solid domain of the AAV and temperature distribution data of an outer wall of the solid domain of the AAV; and outputting the vaporization medium outlet temperature $T_{out}$ and the vaporization medium outlet flow velocity $v_{out}$ of the AAV;

S214: transferring the overall geometric model in the fluid analysis module into the thermal analysis module, and inputting the material parameters of the AAV into the thermal analysis module, wherein the vaporizer material parameters in step S11 are used as the material parameters, and the vaporizer solid domain is used as the calculation domain; then transferring the temperature distribution data of the inner wall and the temperature distribution data of the outer wall of the solid domain of the AAV obtained by the fluid analysis module via simulated calculation into the thermal analysis module to serve as the boundary conditions of the thermal analysis module, and performing, by the thermal analysis module, heat simulation analysis on the body of the AAV to obtain temperature distribution data of the vaporizer body; and inputting calculated result data output by the thermal analysis module into a computational fluid dynamics (CFD) post-processing software, and then outputting a temperature contour of the body of the AAV;

S30: validating accuracy of a fluid-thermal coupling calculated result, and modifying a relevant model, wherein specific processes are as follows:

performing comparative calculation on the vaporization medium outlet temperature $T_{out}$ obtained in step S213 and the vaporization medium outlet temperature $T_{p,out}$ obtained in step S10 to obtain a first error value $\delta_1$, wherein a calculation formula is $\delta_1 = |T_{out} - T_{p,out}|/T_{p,out} * 100\%$; selecting, by the CFD result visualization software, point locations the same as those in the temperature fields of the finned tubes in step S10 from the temperature contour of the body of the AAV, and determining a temperature $T_{n,fin}$ of each point location; then performing comparative calculation on the temperature $T_{n,fin}$ and the test result $T_{pn,fin}$ of the temperature fields of the finned tubes in step S10 to obtain a second error value $\delta_2$, wherein a calculation formula is $\delta_2 = |\Sigma T_{n,fin} - \Sigma T_{pn,fin}|/\Sigma T_{pn,fin} * 100\%$, where, $\Sigma T_{pn,fin}$ indicates a summation of a temperature of a middle position of an outer wall of each finned tube on the outermost layer of the vaporizer in the test result of the temperature fields of the finned tubes in step S10, and $\Sigma T_{n,fin}$ indicates a summation of the temperature of each point location obtained after selecting the point locations the same as those in the temperature fields of the finned tubes in step S10 from the temperature contour; and if the first error value $\delta_1$ or the second error value $\delta_2$ goes beyond 5%, modifying the Mixture model, the Realizable k-ε model and the Lee model in the fluid analysis module in step S211 till the first error value $\delta_1$ and the second error value $\delta_2$ output based on simulated calculation after model modification are both less than or equal to 5%, and then taking the Mixture model, the Realizable k-ε model and the Lee model in the optimized fluid analysis module as optimized fluid-thermal coupling condition settings for fluid-thermal-structure coupling calculation in a next step;

step 2: adopting the modified fluid-thermal coupling condition settings in step 1 in the FEA software to establish a fluid-thermal-structure coupling calculation method of an AAV for validation, then performing fluid-thermal-structure coupling calculation, adding a submodel module for optimization and validation tests, and solving a stress value of a final stress concentration zone of the AAV, wherein specific processes are as follows:

S40: determining material parameters of the AAV for validation, wherein a material of the AAV for validation should be the same as that of an AAV to be evaluated;

S41: obtaining a stress-life curve of the material of the AAV for validation; and sampling the material of the AAV for validation, then performing a material tensile test and a material fatigue test to obtain a S-N curve via fitting, and obtaining a relational expression Log(N)=a+b*Log(S), where, a and b are constant terms;

S50: performing geometric modeling, mesh generation and the determination of the calculation domains of the AAV for validation via a method as mentioned in step S20;

S51: performing, by the FEA software, fluid-thermal-structure coupling simulated calculation to obtain temperature distribution and stress contours of the body of the AAV validation, wherein specific processes are as follows:

S511: replacing the AAV model with the AAV model for validation, executing step S210, replacing the fluid-thermal coupling condition in step S211 with the optimized fluid-thermal coupling condition in S30, setting the fluid material of the vaporization medium fluid domain as liquid nitrogen, with parameters deriving from existing physical parameter data of the liquid nitrogen, and then executing steps S211 to S214, to obtain a vaporization medium outlet temperature $T_{out}$ and a vaporization medium outlet flow velocity $v_{out}$ of the AAV for validation and temperature distribution of the body of the AAV for validation;

S512: adding, by the simulation platform in the FEA software, a structural mechanical analysis module, and transferring the geometric model for validation, mesh generation and calculation domains in the thermal analysis module adopted in step S511 into the mechanical analysis module, wherein the vaporizer material parameters obtained in step S40 are used as the material parameters; then performing data transfer between the fluid analysis module adopted in step S511 and the mechanical analysis module, and transferring pressure distribution data of the inner wall of the solid domain of the AAV for validation obtained by the fluid analysis module via simulated calculation into the mechanical analysis module as a boundary condition of the mechanical analysis module; meanwhile performing data transfer between the thermal analysis module and the mechanical analysis module, and transferring temperature distribution data of the body of the AAV for validation obtained by the thermal analysis module via simulated calculation into the mechanical analysis module as a boundary condition of the mechanical analysis module; and finally setting each finned tube on an outermost layer of the AAV for validation as a fixed constraint in the mechanical analysis module, setting an inlet end and an outlet end of the AAV for validation as non-friction constraints in the mechanical analysis module, then obtaining, by the mechanical analysis module, stress data of the body of the AAV for validation via calculation, and outputting the stress contour of the AAV for validation;

S52: performing an experimental test on structural stress of the AAV for validation with the liquid nitrogen as a vaporization medium under a certain operation condition and a certain ambient condition, to obtain a stress concentration zone of the AAV for validation and stress values thereof; wherein the experimental test on the structural stress of the vaporizer is performed as follows: pasting strain gages near welded positions of an inlet manifold and branches of the vaporizer and welded positions of the branches and each finned tube on an inlet manifold side before the vaporizer works, and then measuring stress at a point location of each strain gage when the vaporizer works;

S60: adding, by the simulation platform in the FEA software, the submodel module, performing mesh refinement and feature processing on a geometric model of the submodel module, and then modifying coefficients in the material property, wherein specific processes are as follows:

S601: adopting a maximum stress point location in the stress contour output by the mechanical analysis module in step S512 and a maximum stress point location in a structural stress experimental test result in step S52 as initial stress concentration zones of the AAV for validation, and then adding, by the simulation platform in the FEA software, the submodel module; transferring the material property parameters of the mechanical analysis module into the submodel module in the context of the mechanical analysis module as a body, extracting part of geometric solids around the initial stress concentration zone from the geometric model in the sub-model module, performing mesh refinement processing, and performing feature processing on welded positions at connection positions between the inlet manifold and the inlet branches and between an outlet manifold and the outlet branches, wherein the feature processing refers to a process of transforming right-angle connection of the manifolds and the branches into arc transition connection in a process of establishing the geometric model, so as to obtain an optimized submodel; and then performing data transfer between the mechanical analysis module and the sub-model module, transferring stress data of the AAV for validation in step S512 obtained by the mechanical analysis module via calculation into the submodel module as a boundary condition of the submodel module, and solving a stress value of a final stress concentration zone of the AAV for validation;

S602: performing comparative calculation on a maximum stress value $S_{max}$ of the final stress concentration zone output by the sub-model module and a stress point maximum value $S_{p,\ max}$ in the structural stress experimental test result in step S52 to obtain a third error value $\delta_3$, wherein a calculation formula is $\delta_3=|S_{max}-S_{p,max}|/S_{p,max}*100\%$; modifying the setting of the material parameters in step S512 if the third error value $\delta_3$ goes beyond 5% till the third error value $\delta_3$ is within 5%; wherein the material parameter comprising a heat conduction coefficient, elasticity modulus, heat expansion coefficient, tensile strength, yield strength and the like in the material parameters; and then taking the modified heat conduction coefficient, elasticity modulus, heat expansion coefficient and tensile strength and yield strength as optimized fluid-thermal-structure coupling calculation setting conditions for fluid-thermal-structure coupling calculation setting conditions of the AAV to be evaluated in a next step;

step 3, establishing a geometric model of the LNG AAV to be evaluated, performing fluid-thermal-structure coupling calculation on the LNG AAV to be evaluated under a design operation condition and an operation condition of the AAV to be put into service in a certain region according to the optimized fluid-thermal-structure coupling calculation setting conditions in step 2, outputting an outlet temperature $T_{out}$, an outlet flow velocity $v_{out}$ and a stress value of a final stress concentration zone of the LNG AAV to be evaluated, and evaluating vaporization performance and fatigue life of the LNG AAV to be evaluated, wherein specific processes are as follows:

S70: determining a design vaporization capacity $Q_s$, a design pressure $P_s$ and structural parameters of the AAV to be evaluated and a historical ambient maximum temperature $T_{a,max}$, minimum temperature $T_{a,min}$ and average temperature $T_{a,ave}$ of a region where the LNG AAV to be evaluated will be applied and an operation vaporization capacity $Q_r$, an operation pressure $P_r$ and a daily start-stop frequency f of the AAV to be put into service; and performing geometric modeling, mesh generation and the determination of calculation domains of the LNG AAV to be evaluated via a method as mentioned in step S20;

S71: performing, by the simulation platform in the FEA software, fluid-thermal-structure coupling calculation on the LNG AAV to be evaluated, and outputting a vaporization medium outlet temperature $T_{out}$, a vaporization medium outlet flow velocity $v_{out}$ and a final stress concentration zone of the LNG AAV to be evaluated, wherein specific processes are as follows:

S711: replacing the AAV model for validation in step S511 with the model of the LNG AAV to be evaluated, and then modifying the boundary conditions of the fluid analysis module in step S511: modifying the outlet pressure of the vaporization medium fluid domain into the design pressure $P_s$ of the AAV to be evaluated; wherein a calculation formula of an inlet velocity vs of the vaporization medium fluid domain is $v_s = Q_s * \rho_n * P_n * T_n / (3600 * B * \rho_{in} * P_{in} * T_{in})$, where, B is a cross-sectional area of an inlet of the vaporizer, pin is density of a vaporization medium at pressure of $P_{in}$, $P_{in}$ is a vaporization medium inlet pressure, $T_{in}$ is a vaporization medium inlet temperature, $Q_s$ is the design vaporization capacity of the AAV to be evaluated, a vaporization medium outlet temperature of an air fluid domain is 20° C. under a standard condition, and the material property of a medium fluid domain is set as LNG; and then operating step S511, and outputting the vaporization medium outlet temperature $T_{out}$ and the vaporization medium outlet flow velocity $v_{out}$ of the LNG AAV to be evaluated under the design operation condition;

S712: replacing the fluid-thermal-structure coupling condition in step S512 with the optimized fluid-thermal-structure coupling condition to operate step S512;

S713: operating step S601, and outputting the stress value of the final stress concentration zone of the LNG AAV to be evaluated under the design operation condition;

S714: performing simulated calculation on the to-be-evaluated vaporizer under the operation condition of the AAV to be put into service after completing simulated calculation under the design operation condition; setting the outlet pressure of the vaporization medium fluid domain as the operation pressure $P_r$, wherein a calculation formula of inlet velocity $v_s$ of the vaporization medium fluid domain is $v_s = Q_r * \rho_n * P_n * T_n / (3600 * B * \rho_r * P_r * T_{in})$, where, $\rho_r$ is density of the vaporization medium at the pressure of $P_r$, $Q_r$ is the operation vaporization capacity of the AAV to be evaluated, and temperatures of the air fluid domain are set as the historical ambient maximum temperature $T_{a,max}$, minimum temperature $T_{a,min}$ and average temperature $T_{a,ave}$ of the region where the to-be-evaluated vaporizer is applied respectively; and then repeating steps S711-S714 for simulated calculation, and outputting the outlet temperature $T_{out}$, the outlet flow velocity $v_{out}$ and the final stress concentration zone of the AAV to be evaluated under the operation parameters till completing coupling simulated calculation at different historical ambient temperatures $T_a$;

S80: evaluating the vaporization performance and the fatigue life of the LNG AAV under the design operation condition and the operation condition of the AAV to be put into service.

2. The performance evaluation method of the LNG AAV according to claim 1, wherein the specific step of testing the temperature distribution of the finned tubes is as follows: measuring, by a temperature sensor, the temperature in the middle position of the outer wall of each finned tube on the outermost layer of the vaporizer.

3. The performance evaluation method of the LNG AAV according to claim 1, wherein the specific step of testing the vaporization performance of the vaporizer is as follows: acquiring, by the temperature sensor, a pressure meter and a flow meter arranged at the outlet of the LNG AAV respectively, the vaporization medium temperature $T_{p,out}$, the vaporization medium pressure $P_{p,out}$ and the vaporization medium flow velocity $v_{p,out}$ at the outlet of the vaporizer; and then calculating the actual vaporization capacity $Q_{out}$ of the AAV during operation, wherein the actual vaporization capacity $Q_{out}$ refers to a vaporization capacity under a standard condition, and a calculation formula is $Q_{out} = 3600 * v_{p,out} * A * \rho_{p,out} * P_{p,out} * T_{p,out} / (\rho_n * P_n * T_n)$, where, A is a cross-sectional area of the outlet of the vaporizer, $\rho_{p,out}$ is density at the vaporization pressure of $P_{p,out}$, $P_n$ is a pressure under the standard condition, $T_n$ is a temperature under the standard condition, and $\rho_n$ is density of the vaporization medium under the standard condition.

4. The performance evaluation method of the LNG AAV according to claim 3, wherein in the experimental test on the structural stress of the vaporizer, in addition to pasting strain gages near the welded positions of the inlet manifold and the branches of the vaporizer and the welded positions of the branches and each finned tube on an inlet manifold side, strain gages are also pasted in the stress concentration zone in the stress contour according to the stress contour output in step 512 for stress testing.

5. The performance evaluation method of the LNG AAV according to claim 4, wherein the method for evaluating the vaporization performance of the LNG AAV under the design operation condition comprises: calculating the vaporization capacity $Q_{out}$ of the to-be-evaluated vaporizer corresponding to the outlet flow velocity $v_{out}$ according to the vaporization medium outlet temperature $T_{out}$ and the vaporization medium outlet flow velocity $v_{out}$ under the design operation condition output in step S711 and the vaporization capacity calculation formula in step S10, and judging whether a difference between the vaporization medium outlet temperature $T_{out}$ and the ambient temperature $T_a$ meets requirements in standards, to output whether the calculated vaporization capacity $Q_{out}$ is greater than or equal to the design vaporization capacity $Q_s$, so as to evaluate the vaporization performance of the AAV under the design operation condition; and the method for evaluating the fatigue life of the LNG AAV under the design operation condition comprises: comparing stress values of the final stress concentration zone under the design operation condition output in step S713, selecting the maximum stress value $S_{max}$ and substituting it into the S-N curve relational expression $Log(N) = a + b * Log(S)$ obtained in step S41, and calculating the fatigue life frequency N of the vaporizer; and calculating a maximum service life $n = N/(f*365)$ of the vaporizer according to the daily start-stop frequency f of the vaporizer, so as to achieve the evaluation on the fatigue life of the LNG AAV under the design operation condition.

6. The performance evaluation method of the LNG AAV according to claim 4, wherein the method for evaluating the vaporization performance of the LNG AAV under the operation condition of the AAV to be put into service comprises: calculating vaporization capacity $Q_{out}$ of the to-be-evaluated vaporizer corresponding to different outlet flow velocities $v_{out}$ according to the vaporization medium outlet temperature $T_{out}$ and the vaporization medium outlet flow velocity $v_{out}$ under the operation condition of the AAV to be put into service output in step S714 and the vaporization capacity calculation formula in step S10, and judging whether a difference between the vaporization medium outlet temperature $T_{out}$ and the ambient temperature $T_a$ under operation conditions of different ambient temperatures $T_a$ meets requirements in standards, to output whether the calculated vaporization capacity $Q_{out}$ are greater than or equal to the operation vaporization capacity $Q_r$, so as to evaluate the vaporization performance of the AAV under the operation condition of the AAV to be put into service in a certain region; and the method for evaluating the fatigue life under the operation condition of the AAV to be put into service comprises: comparing stress values of the final stress concentration zone under different operation conditions of the AAV to be put into service output in step S714, selecting the maximum stress value $S_{max}$ and substituting it into the S-N curve relational expression Log(N)= a+b*Log(S) obtained in step S41, and calculating the fatigue life frequency N of the vaporizer; and calculating a maximum service life n=N/(f*365) of the vaporizer according to the daily start-stop frequency f of the vaporizer, so as to achieve the evaluation on the fatigue life of the LNG AAV operating in a certain region.

7. The performance evaluation method of the LNG AAV according to claim 2, wherein the specific step of testing the vaporization performance of the vaporizer is as follows: acquiring, by the temperature sensor, a pressure meter and a flow meter arranged at the outlet of the LNG AAV respectively, the vaporization medium temperature $T_{p,out}$, the vaporization medium pressure $P_{p,out}$ and the vaporization medium flow velocity $v_{p,out}$ at the outlet of the vaporizer; and then calculating the actual vaporization capacity $Q_{out}$ of the AAV during operation, wherein the actual vaporization capacity $Q_{out}$ refers to a vaporization capacity under a standard condition, and a calculation formula is $Q_{out}=3600*v_{p,out}*A*\rho_{p,out}*P_{p,out}*T_{p,out}/(P_n*P_n*T_n)$, where, A is a cross-sectional area of the outlet of the vaporizer, $\rho_{p,out}$ is density at the vaporization pressure of $P_{p,out}$, $P_n$ is a pressure under the standard condition, $T_n$ is a temperature under the standard condition, and $\rho_n$ is density of the vaporization medium under the standard condition.

* * * * *